(12) United States Patent
Marty et al.

(10) Patent No.: US 6,180,520 B1
(45) Date of Patent: Jan. 30, 2001

(54) MULTIPLE LAYER INTERCONNECTS WITH LOW STRAY LATERAL CAPACITANCE

(75) Inventors: Michel Marty, Varces; Gérard Passemard, La Terrasse; Graeme Wyborn, Montbonnot, all of (FR)

(73) Assignee: SGS-Thomson Microelectronics S.A., Gentilly (FR)

( * ) Notice: Under 35 U.S.C. 154(b), the term of this patent shall be extended for 0 days.

(21) Appl. No.: 08/826,921

(22) Filed: Apr. 8, 1997

(30) Foreign Application Priority Data

Apr. 10, 1996 (FR) .................................................. 96 04746

(51) Int. Cl.$^7$ .................................................. H01L 21/44
(52) U.S. Cl. ........................... 438/654; 438/656; 438/688
(58) Field of Search .................... 438/648, 656, 438/654, 685, 688

(56) References Cited

U.S. PATENT DOCUMENTS

| | | | |
|---|---|---|---|
| 5,328,553 | 7/1994 | Poon | 156/636 |
| 5,341,026 | * 8/1994 | Harada et al. | 257/764 |
| 5,360,995 | * 11/1994 | Graas . | |
| 5,399,530 | * 3/1995 | Kenmotsu . | |
| 5,480,836 | 1/1996 | Harada et al. | 437/192 |
| 5,534,463 | 7/1996 | Lee et al. | 437/195 |
| 5,604,155 | * 2/1997 | Wang . | |
| 5,635,763 | * 6/1997 | Inoue et al. . | |

FOREIGN PATENT DOCUMENTS 0 680 085    11/1995 (EP) .............................. H01L/21/76
62-132359  *  6/1987 (JP) .

OTHER PUBLICATIONS

French Search Report from French Patent Application 96 04746, filed Apr. 10, 1996.
Hiroshi Nishimura, et al. "Reliable Submicron Vias Using Aluminum Alloy High–Temperature Sputter Filling" Proc. 8th Int. IEEE VLSI Multilevel Interconnect. Conf. pp. 170–176, Jun. 1991.*
Hisako Ono, et al. "Development of a Planarized Al–Si Contact Filling Technology". Proc. 7th Int. IEEE VLSI Multilevel Interconnection Conf. pp. 76–82, Jun. 1990.*

* cited by examiner

Primary Examiner—C. Everhart
(74) Attorney, Agent, or Firm—Wolf, Greenfield & Sacks, P.C.; James H. Morris; Theodore E. Galanthay

(57) ABSTRACT

The present invention relates to an interconnect structure wherein the upper surface of the first interconnect level is a tungsten layer, portions of the first interconnect level are insulated from one another by an insulator of the SOG type, portions of a second interconnect level are connected to portions of the first interconnect level by conductive pads formed in openings of an insulating layer, at least the lower part of which is of the SOG type, the walls and the bottom of the openings are covered with a thin titanium layer, and the openings are filled with a conductive material selected in the group including Al, Cu and aluminum alloys such as silicon, copper, and titanium alloys.

14 Claims, 1 Drawing Sheet

MULTIPLE LAYER INTERCONNECTS WITH LOW STRAY LATERAL CAPACITANCE

BACKGROUND OF THE INVENTION

1. Field of the Invention

The present invention relates generally to the field of semiconductor components and more specifically to the field of integrated circuits. It more particularly relates to the structure and manufacturing of multiple layer connection networks formed on such components.

2. Discussion of the Related Art

An integrated circuit formed on a silicon chip includes various regions with different types of dopings, for example corresponding to drains, sources and gates of MOS transistors. Contacts have to be made on these regions, some of the regions must be interconnected, and access must be provided to output terminals. To solve the interconnect and connection crossing problems, several levels of interconnects have to be made. These interconnect levels are currently called metallizations. It should be noted that the conductive connection components are not always metals but can also be formed from several other conductive materials. In the following description, the expression "metallization level" designates a conductive layer formed at a given stage and etched appropriately. The expression "via" designates a path formed in a insulating layer between two metallization levels and filled with a conductive material to enable localized connections between portions of two separate metallization levels.

Several structures and methods used to construct these metallization layers and vias are known. However, there is a constant need for improvement of these structures and methods due to the increasing miniaturization of integrated circuits. Presently, elementary dimensions lower than 1 $\mu$m are reached. Clearly, structures and methods developed for constructing structures in which the minimal dimensions were higher than one micrometer are no longer adequate and therefore new methods have to be developed. The alterations can sometimes appear to be very slight, but they are of major importance in that they make possible what used to be impossible.

Besides the various problems associated with the proper filling of the vias and the compatibility between materials, the size reduction of integrated circuits particularly increases the acuteness of two particular problems. The first problem lies in the fact that, for large circuits, the stray lateral capacitances between metallization levels dominate the lateral capacitances between portions of a same metallization level, whereas the relationship tends to reverse as the miniaturization increases. The second problem arises because as the miniaturization increases, the number of components formed in a same silicon chip increases and thus the number of connections increases correlatively. As a result, the resistance of the interconnects, the vias and the interconnect/via interfaces becomes a critical problem, in particular when it is desired to have the integrated circuit operate at high frequencies.

SUMMARY OF THE INVENTION

Thus, an object of the present invention is to provide a new structure and a new method for manufacturing interconnect networks capable of overcoming the two above-mentioned problems.

Another object of the present invention is to provide a method for manufacturing interconnect levels essentially using individual techniques known per se in the field of the manufacturing of integrated circuits.

To achieve these objects, the present invention provides an interconnect structure wherein the upper surface of the first interconnect level is a tungsten layer, portions of the first interconnect level are insulated from one another by an insulator of the SOG type, portions of a second interconnect level are connected to portions of the first interconnect level by conductive pads formed in openings of an insulating layer, at least the lower part of which is of the SOG type, the walls and the bottom of the openings are covered with a thin titanium layer, and the openings are filled with a conductive material selected in the group including Al, Cu and aluminum alloys such as silicon, copper, and titanium alloys.

According to an embodiment of the present invention, a thin titanium nitride TiN layer is formed under the thin titanium layer.

According to an embodiment of the present invention, the thickness of the titanium layer is lower than 30 nm and preferably lower than 10 nm.

According to an embodiment of the present invention, the thickness of the TiN layer is around ten nanometers The present invention also provides a method for forming two levels of an interconnect structure including the steps of forming a first interconnect level in a material selected from the group including Al, Cu and aluminum alloys such as silicon, copper, and titanium alloys, etching the first interconnect level according to a selected pattern, covering the structure with an insulating layer, the lower part of which, extending between the portions of the first interconnect level and over the upper surface of the first interconnect level, is in a material of the SOG type, etching openings in the insulating layer which face selected portions of the first interconnect level, depositing a thin titanium layer, forming a second interconnect level and filling the openings by deposition at a temperature higher than 500° C. of a material selected from the group including Al, Cu and aluminum alloys.

According to an embodiment of the present invention, the method further includes the step of depositing on the second interconnect level a thin titanium layer and a thin tungsten layer and etching the second interconnect level according to selected patterns.

According to an embodiment of the present invention, a thin TiN layer is deposited before the thin titanium layer.

According to an embodiment of the present invention, the thickness of the titanium layer is lower than 30 nm and preferably lower than 10 nm.

According to an embodiment of the present invention, the thickness of the TiN layer is around ten nanometers.

BRIEF DESCRIPTION OF THE DRAWING

These objects, characteristics and advantages as well as others, of the present invention, will be discussed in detail in the following non-limiting description of a specific embodiment in relation with the accompanying drawing, wherein.

DETAILED DESCRIPTION

Figure 1:
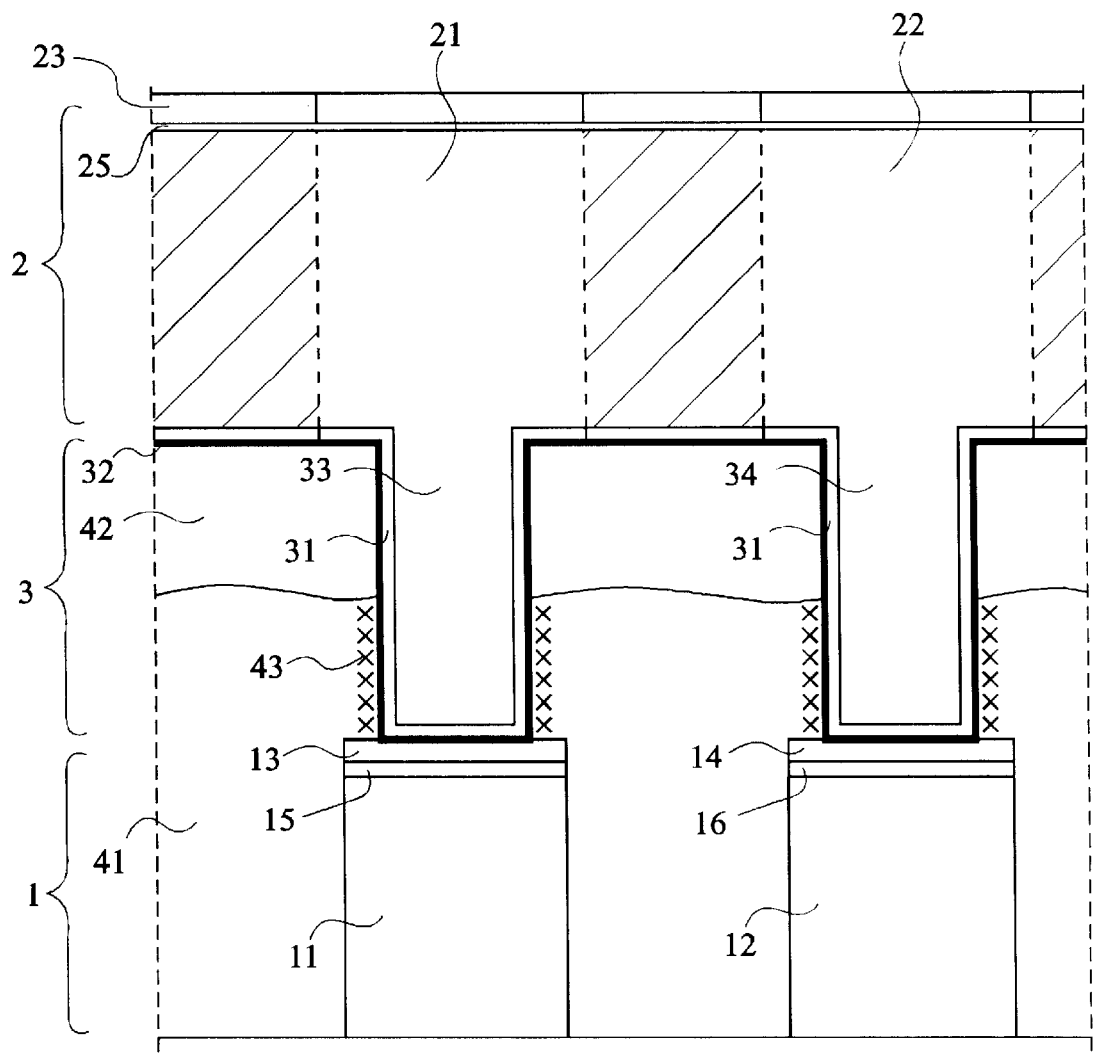
FIG. 1 is a cross-sectional view of a portion of two levels of an interconnect structure according to the present invention.

Generally, FIG. 1 is divided vertically into three areas, an area 1 wherein portions of a first metallization level can be seen, an area 2 where portions of a second metallization level can be seen and an area 3 including vias connecting selected portions of the first and second metallization levels.

It should be clear that, although for simplicity a first and a second metallization are mentioned in the present description, this does not mean that the first metallization level is the lowest level of an interconnect structure. This first level can be any intermediary level, itself formed over a lower metallization level. In this case, the assembly between this intermediary level and the lower level will be of the same type as that described herein in relation with the first and second metallization levels.

More particularly, in the drawing two portions of metallization 11 and 12, which can be pads, connection lines or portions of connection lines, have been shown for the first metallization level 1. These regions 11 and 12 result from a uniform deposition of a metallization layer followed by an etching. The first level of metallization is coated with a layer of insulating material which fills the spaces between portions 11 and 12 and covers the whole structure.

With the present technologies, the height of the conductive portions 11 and 12 can be around 1 $\mu$m while the distance between these portions 11 and 12 can be 0.5 $\mu$m only. It can thus be seen that the lateral capacitance between these portions is no longer negligible.

To reduce stray lateral capacitances, according to a first aspect of the present invention, an insulating agent is used between and over portions 11 and 12. The insulating agent used here is a product commonly designated in the art by the acronym SOG, for "spun on glass". In particular, an organic SOG made of a polysiloxane is used to which a diluting agent (alcohol) has been added. After annealing an insulator is formed with a dielectric constant lower than 3 and typically of a value from 2.6 to 2.8. As a comparison, it should be noted that the insulators conventionally used in modern technologies are TEOS oxide formed from tetraethylorthosilane, the dielectric constant of which is 4.4, or an oxide deposited by electronic cyclotronic resonance, the dielectric constant of which is around 4. More particularly, the SOG layer is formed by spin-on deposition of the above-mentioned product (polysiloxane plus alcohol), followed by an annealing at a temperature of 400 to 500° C. to exhaust the diluting agent and polymerize the material. The material essentially turns into silicon oxide ($SiO_x$) to which carbonated or hydrogenated radicals are added. This method has the advantage of not implying steps performed in a plasma for the deposition, wherefrom there results that no charges are created within the formed insulating layer. Further, this deposition is inexpensive and does not require sophisticated equipment.

It should be noted that this use of SOG as an insulator of an interconnect level is not usual, SOG being generally used in the art essentially for its planarizing abilities. Indeed, after deposition and annealing, the SOG layer has a substantially planar surface.

In FIG. 1, the insulating layer of the first interconnect level has been referred to by references 41 and 42. Reference 41 designates the SOG layer. Although it has been noted that SOG has natural planarizing qualities, its upper surface is actually not perfectly planar at the submicrometric scale. It will thus be preferred, for very small structures, to deposit back over the SOG layer 41 a TEOS layer 42, and then proceed to a chemical and mechanical planarization (CMP) step.

After forming insulation 41–42, the insulating layer is conventionally etched at the locations where vias are desired to be formed. For this purpose, the insulating layer is coated with a resist which is open at the appropriate locations to provide an etching mask for the insulator. The vias 3 are then etched until the upper surface of target portions 11 and 12 of the first interconnect level is reached. After this, the resist is removed to prepare the next steps. A known disadvantage of SOG is that it is a microporous material and that, as the resist is removed in the presence of oxygen, the oxygen penetrates into the channels and forms, together with the components of the SOG, water molecules and other oxidizing components which are then likely to desorb during vacuum thermal processings or under plasma and to oxidize the surfaces which are apparent or under processing. This contaminated area is symbolized in the drawing by crosses 43. This is probably the reason why, in prior art, the use of SOG as an insulating material has been avoided, and particularly in those areas where the vias are formed.

According to a second aspect of the present invention, it is provided to use, as main materials of the interconnect layers and the vias, highly conductive materials such as aluminum, copper, or aluminum alloys with Cu, Si, Ti . . . (for example AlSi, AlSiCu, AlSiTi) by a method avoiding any disadvantage linked with possible desorptions of oxidizing components from the etched parts of an SOG layer.

Thus, according to the present invention, portions 11 and 12 are made of Al, Cu or an aluminum alloy. The upper surface of each of the portions 11 and 12 is coated with a tungsten layer, respectively 13 and 14. In the case where the first metallization level is made of Al or an aluminum alloy, a thin TiN layer, respectively 15 and 16, is provided between regions 11–13 and 12–14 to avoid the formation of an insulating film resulting from reactions between fluorine and aluminum, the presence of fluorine being due to the fact that tungsten depositions are performed with tungsten fluorides.

Then, after the above-described formation of the openings in insulating layer 41–42, a thin titanium layer 31 which coats the surface of the structure as well as the lateral and bottom walls of the openings is uniformly deposited.

It should be noted that, during the titanium deposition, the presence of upper tungsten layers 13 and 14 avoids any disadvantage linked with a desorption of oxidizing sites 43 since the tungsten oxides are volatile and are exhausted without creating an insulating layer.

Then, depositions of an aluminum, copper or aluminum alloy layer which forms the second interconnect level 2 and the filling 33, 34 of the vias are performed. The filling is performed by using a high temperature deposition technique. In the case of aluminum, the deposition is performed at a plate temperature higher than 400° C. so that the metal flows into the via during the deposition. The metal wettability along the via walls is enhanced by titanium sub-layer 31.

Before the deposition of the thin titanium layer 31, a thin titanium nitride (TiN) layer (32) can be deposited. In the case where the second interconnect level 2 is an intermediary level and where it is envisaged to form another level according to the present invention over this second level, the metal layer is coated with a tungsten layer 23, a TiN layer 25 being interposed therebetween. Then, the second interconnect level is etched to leave pads or tracks 21, 22 by eliminating the parts illustrated by hatchings in the drawing.

To reduce resistivity, the present invention has a significant advantage with respect to structures using tungsten for vias or interconnect layers. Indeed, the resistivity of aluminum is around 3 $\mu\Omega$/cm whereas that of tungsten is around 11 $\mu\Omega$/cm.

If the second interconnect level is aluminum and the pad filling also is aluminum (or an aluminum alloy or Cu), the barrier and wettability layer 31 (Ti) can be much thinner than in prior art. Indeed, when the second interconnect level is desired to be etched, if this level or the filling of the via is in tungsten, a fluorided plasma is used for the etching. A fluorided plasma has a low selectivity between the tungsten etching and the oxide etching. It is then advantageous for the TiN or Ti/TiN barrier layer to be relatively thick (higher than 100 nm) on the upper surface of insulating layer 41–42 to enable a stop for the etching of the second interconnect level. Conversely, an aluminum or aluminum alloy layer is etched with a chlorinated plasma which is very selective with respect to the oxide. It is then no longer necessary to provide an etching stop layer and the thickness of barrier layer 31 is reduced to its minimum to only conform to its barrier and wettability function and no longer to the function of stopping the etching. The reduction of the thickness of these layers is particularly important in practice since titanium has a resistivity of around 13 $\mu\Omega$/cm and TiN has a resistivity of around 70 $\mu\Omega$/cm. According to the invention, a titanium layer with a thickness of 10 to 30 nm on the sides of the vias and possibly an underlying TiN layer with a thickness of around 10 nm can be used.

Thus, by using techniques which are simple and known per se, a significant reduction of stray capacitances and especially of the lateral stray capacitance of the interconnects and of the contact resistance may be obtained.

Of course, the present invention is likely to have various alterations, modifications and improvements which will readily occur to those skilled in the art. For example, several known deposition methods may also be used to obtain similar results.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming two levels of an interconnect structure, including the steps of:
    forming a first interconnect level in a material selected from the group consisting Al, Cu and aluminum alloys such as silicon, copper and titanium alloys;
    etching the first interconnect level according to a selected pattern;
    depositing a tungsten layer on the first interconnect level;
    covering said first interconnect level structure with an insulating layer, said insulating layer including an SOG portion;
    etching openings in the insulating layer, said openings facing said first interconnect level;
    depositing a titanium layer over said insulating layer;
    forming a second interconnect level and filling said etched openings of said insulating layer by depositing at a temperature higher than 500° C. of a material selected from the group including Al, Cu and aluminum alloys,
    wherein the thickness of the titanium layer is lower than 30 nm and preferably lower than 10 nm.

2. A method according to claim 1, further including the step of depositing on the second interconnect level a titanium layer and a tungsten layer and etching the second interconnect level according to selected patterns.

3. A method according to claim 1, wherein a TiN layer is deposited on said interconnect level, and the titanium layer is deposited on said TiN layer.

4. A method according to claim wherein the thickness of the TiN layer is around ten nanometers.

5. A method for forming two levels of an interconnect structure comprising the steps of:
    forming a first interconnect level in a highly conductive material;
    etching the first interconnect level according to a selected pattern to provide a plurality of spaced portions;
    depositing a tungsten layer on the first interconnected level;
    covering said first interconnect level structure with an insulating layer, said insulating layer including an SOG type portion;
    etching openings in the insulating layer, said openings facing said spaced portions of said first interconnect level;
    depositing a titanium layer having a thickness less than 30 nm over said insulating layer; and
    forming a second interconnect level over said titanium layer, said second interconnect level extending into said openings of said insulating layer wherein the second interconnect level comprises Al, Cu and aluminum alloys.

6. The method as recited in claim 5, wherein said step of etching further comprises the steps of:
    coating said insulating layer with a resist having openings disposed over said spaced portions of said first interconnect level;
    etching said insulator exposed by said openings of said resist to form vias toward said first interconnect level; and
    removing said resist.

7. The method according to claim 5, wherein said step of forming said second interconnect level further comprises the step of filling said etched openings of said insulating layer by depositing a second highly conductive material heated to a temperature onto said insulating layer.

8. The method according to claim 7, wherein said temperature is higher than 500° C. and said second highly conductive material is selected from a group including Al, Cu and aluminum alloys.

9. The method according to claim 5, wherein said insulating layer further comprises a tetraethylorthosilane (TEOS) portion disposed over said SOG type portion.

10. The method according to claim 5, further comprising the step of depositing a titanium nitrate (TiN) layer between said insulating layer and said titanium layer.

11. The method according to claim 5, further comprising the step of depositing, on said second interconnect level, a tungsten layer.

12. The method according to claim 11, further comprising the step of depositing, between said tungsten layer and said second interconnect level, a titanium nitride (TiN) layer.

13. The method according to claim 11, further comprising the step of etching said tungsten layer of said second interconnect level using a chlorinated plasma.

14. A method for forming two levels of an interconnect structure comprising:
    forming a first interconnect level in a first highly conductive material;
    etching the first interconnect level according to a selected pattern to provide a plurality of spaced portions;
    depositing a tungsten layer on the first interconnect level;
    covering said first interconnect level structure with an insulating layer, said insulating layer including an SOG type portion;

coating said insulating layer with a resist having openings disposed over said spaced portions of said first interconnect level;

etching said insulator exposed by said openings of said resist to form vias toward said first interconnect level; and removing said resist;

depositing a titanium layer having a thickness less than 30 nm over said etched insulating layer;

forming a second interconnect level over said titanium layer by filling said etched openings of said insulating layer with of a highly conductive material heated to a predetermined temperature, said second interconnect level extending into said openings of said insulating layer wherein the second interconnect level comprises Al, Cu and aluminum alloys;

depositing a titanium nitride (TiN) layer on said second interconnect level;

depositing a tungsten layer on said TiN layer; and etching said tungsten layer of said second interconnect level using a chlorinated plasma.

* * * * *